United States Patent [19]
Feygenson

[11] Patent Number: 4,812,890
[45] Date of Patent: Mar. 14, 1989

[54] BIPOLAR MICROWAVE INTEGRATABLE TRANSISTOR

[75] Inventor: Anatoly Feygenson, Reading, Pa.

[73] Assignee: Thompson-CSF Components Corporation, Montgomeryville, Pa.

[21] Appl. No.: 45,176

[22] Filed: Apr. 22, 1987

Related U.S. Application Data

[63] Continuation of Ser. No. 799,419, Nov. 19, 1985, abandoned.

[51] Int. Cl.⁴ .................. H01L 29/72; H01L 29/04; H01L 27/02
[52] U.S. Cl. ........................ 357/34; 357/59; 357/44; 357/46
[58] Field of Search ............. 357/34, 36, 59 H, 59 K, 357/44, 46, 92, 55, 56

[56] References Cited

U.S. PATENT DOCUMENTS

| 3,244,950 | 4/1966 | Ferguson | 357/46 |
| 3,600,651 | 8/1971 | Duncan | 357/59 |
| 3,611,067 | 10/1971 | Oberlin et al. | 357/44 |
| 3,619,738 | 10/1971 | Otsuka | 317/235 |
| 3,801,836 | 4/1974 | Castrucci et al. | 357/36 |
| 3,865,648 | 2/1975 | Castrucci et al. | 357/36 |
| 4,190,466 | 2/1980 | Bhattacharyya et al. | 357/36 |
| 4,255,674 | 3/1981 | Grenier et al. | 357/36 |
| 4,303,933 | 12/1981 | Horng et al. | 357/56 |
| 4,345,266 | 8/1982 | Owyang | 357/34 |
| 4,370,670 | 1/1983 | Nawata et al. | 357/36 |
| 4,400,715 | 8/1983 | Barbee et al. | 357/4 |
| 4,554,570 | 10/1985 | Jastrzebski et al. | 357/4 |
| 4,696,097 | 9/1987 | McLaughlin et al. | 357/34 |

OTHER PUBLICATIONS

Maserjian, "Single-Crystal Germanium Films by Microzone Melting", Solid State Electronics, Pergamon Press, 1963, vol. 6, pp. 477–484.
Douglas, "The Route to 3-D Chips", High Technology, Sep. 1983, pp. 55–59.
Robinson et al., "Large Area Recrystallization of Polysilicon", Journal of Crystal Growth 63 (1983), pp. 484–492.
Cohen, C., "Upwardly Operating Bipolar Transistors . . .", Electronics, Sep. 22, 1982, pp. 85–86.
Tang et al., "Symmetrical Bipolar Structure", IEEE CH1616-2, 1980, pp. 58–60.

Primary Examiner—Andrew J. James
Assistant Examiner—Robert P. Limanek
Attorney, Agent, or Firm—Ratner & Prestia

[57] ABSTRACT

A method of fabricating bipolar intergratable transistors includes a recrystallization step. A monocrystalline epitaxial layer is deposited upon a highly doped substrate and impurities are introduced into a portion of the epitaxial layer to form a first transistor region. A polysilicon layer is deposited upon the surface and a portion of the polycrystalline layer is recrystallized wherein the first transistor region serves as a seed. Impurities are introduced into the recrystallized portion to form a base. An additional polysilicon layer is deposited over the substrate and a portion is recrystallized wherein the base serves as a seed. A second transistor region is formed in the recrystallized portion of the additional polysilicon layer.

8 Claims, 2 Drawing Sheets

BIPOLAR MICROWAVE INTEGRATABLE TRANSISTOR

This application is a continuation of application Ser. No. 799,419, filed Nov. 19, 1985, now abandoned.

BACKGROUND OF THE INVENTION

1. Field of the Invention

This invention relates to the field of fabrication of transistors and, in particular, in situ recrystallization fabrication wherein the emitters are electrically coupled by the substrate.

2. Background Art

In microwave circuits, it is often desirable to have multistage, common emitter circuits because these circuits are capable of achieving a predictable gain. However, there is often a problem with coupling the emitters of two adjacent stages. If the coupling is done with gold or aluminum wire parasitic inductance associated with the wire will manifest itself as a feedback element at microwave frequencies. This parasitic inductance reduces the speed and the gain of the circuit. Common collector circuits are not suitable because multistage common collector transistor circuits cannot achieve a high gain.

Another way of conventionally coupling stages is the use of capacitive isolation between the stages. This introduces parasitic capacitance which is responsible for speed and gain degradation at microwave frequencies. Attempts to use common collector circuits have not been successful because of the inherently low gain of common collector circuits. The highest speed circuit would be one with a common emitter configuration without any coupling parasitics.

An alternative of building the emitter in the substrate to eliminate the need for external connections between the emitters could not be achieved because the conductivity type of each successive layer in building the transistor must be opposite that of the layer below it. This requires overcompensation at each layer. For example, one could start with a lightly doped substrate and then introduce a P-type dopant to create a P-type layer. The next layer, which must be an N-type layer, must therefore contain enough N-type dopant to first overcompensate for the P-type dopant before it can be further doped to the proper N concentration. This must be repeated for each layer.

The result of this is that the most heavily doped transistor element is on the top, while the most lightly doped and heavily resistive transistor element is on the bottom. The lightly doped resistive bottom transistor element, therefore, has low injection efficiency and is not suitable for use as an emitter. Furthermore, overcompensation in the base causes noise.

A desirable alternative would be to have a layer of undoped monocrystalline semiconductor material for each transistor element, wherein overcompensation for previous doping is not required before doping to the required level. However, when a layer of semiconductor material is deposited upon a substrate during the fabrication process, it is deposited in a polycrystalline structure.

In such polycrystalline structures, there are "grains" or regions of material which are in pure crystalline form. These grains have random orientation with respect to each other. This is to be distinguished from the monolithic, monocrystalline structure formed when rod-pulling is performed using a monocrystalline seed or vapor (liquid) phase epitaxial process. In the polycrystalline structure, the grain boundaries interfere with the electrical properties of the semiconductor material. It is, therefore, desirable to recrystalize the polycrystalline material which has been deposited on a substrate to create monocrystalline material, thereby allowing each transistor element to be doped independently.

Technology for growing single crystalline germanium films in situ is known. For example, in "Single-Crystal Germanium Films by Microzone Melting" by J. Maserjian in *Solid-State Electronics*, Pergamon Press, 1963, Vol. 6, pp. 477–478, the use of an electron beam to melt a small zone of polycrystalline germanium is taught. J. Douglas, in "The Route to 3-D Chips," High Technology, September, 1983, shows the use of a laser beam, a strip heater, and a focused mercury arc lamp to achieve recrystallization. However, the use of laterally proceeding heat sources and small zone techniques such as laser or E-beam heating, create lateral thermal gradients which are difficult to control and adversely affect circuit reliability.

For purposes of considering the patentability of the invention disclosed and claimed herein, a brief patentability search was conducted. The patents identified to be of possible interest in that search were:

| Patent Number | Inventor(s) |
| --- | --- |
| 4,370,670 | Nawata, et al. |
| 4,359,754 | Hayakawa, et al. |
| 4,345,266 | Owyang |
| 4,329,772 | Oikawa, et al. |
| 4,255,674 | Grenier, et al. |
| 4,190,466 | Bhattacharyya, et al. |
| 3,865,648 | Castrucci, et al. |
| 3,801,836 | Castrucci, et al. |
| 3,619,738 | Otsuka |

It is, therefore, an object of the present invention to provide recrystallization of polysilicon during fabrication process.

It is a further object of the present invention to provide a processing sequence for bipolar microwave integratable transistors which eliminates the requirement for overcompensation in successive P- and N-type layers.

It is, another object of the present invention to provide an integratable bipolar microwave transistor in which the emitters of a multistage common emitter circuit may be coupled without speed reduction due to the presence of common-lead parasitic inductance and capacitance.

SUMMARY OF THE INVENTION

A device and a method of fabricating bipolar integratable transistors include a recrystallization step. A monocrystalline epitaxial layer is deposited upon a highly doped substrate and impurities are introduced into a portion of the epitaxial layer to form a first transistor region. A polysilicon layer is deposited upon the surface and a portion of the polycrystalline layer is recrystallized wherein the first transistor region serves as a seed. Impurities are introduced into the recrystallized portion to form a base.

DETAILED DESCRIPTION OF THE INVENTION

FIGS. 1 to 10 disclose an embodiment of the manufacturing method of a microwave bipolar transistor according to the present invention. It will be emphasized that, in these drawings, according to common use in semiconductor representation, the various layers are not drawn to scale. On the contrary, the width or length and thickness of the various layers are arbitrarily expanded or reduced for improving the legibility.

Figure 1:
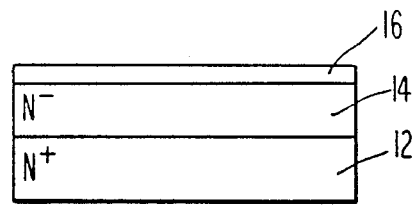
FIGS. 1 to 9 show the fabrication process of the present invention.

FIG. 1 shows the starting material for the transistor as an N+monocrystalline layer 12 of silicon, upon which an N− monocrystalline epitaxial layer 14 is grown. Layer 12 is of a type which is conventionally used in the manufacturing of RF bipolar transistors and is heavily doped to produce high conductivity. Although N-type material was chosen as the composition of layer 12 for the purpose of illustration, it should be understood that P-type material may also be used and that the conductivity type of semiconductor materials and dopants would accordingly be reversed thus producing a PNP rather than an NPN transistor. Additionally, it will be understood by those skilled in the art that transistors of opposite polarity may be formed on a single substrate by masking areas of the substrate on which one polarity of transistor is being formed while performing implantations for forming the opposite polarity of transistor.

Layer 12 has a thickness of approximately 200 to 10000 microns and is highly doped in order to reduce resistivity. Epitaxial layer 14 is grown to a thickness of between 0.1 and 5 microns on substrate 12 in a conventional fashion by using liquid or vapor phase epitaxy. Substrate layer 12 may be doped to a concentration of $10^{18}$ and $10^{19}$ dopant atoms per cubic centimeter and epitaxial layer 14 may be doped to a concentration of $10^{15}$ to $10^{16}$ dopant atoms per cubic centimeter.

A silicon dioxide layer 16 with a thickness of 0.2 to 0.6 microns is formed on epitaxial layer 14. This oxidation is accomplished by heating the substrate to 900 to 1200 degrees celsius in the presence of oxygen gas. The thickness of silicon dioxide layer 16 may be 0.2 to 6 microns.

Figure 2:
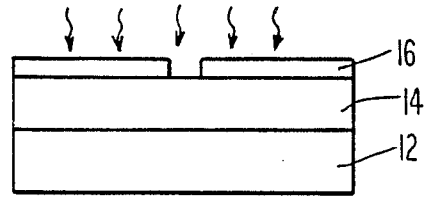

By conventional masking and etching techniques, silicon dioxide layer 16 is provided with an aperture 18 above the region where the integratable bipolar transistor is to be formed as shown in FIG. 2. Next, an N type ion implant is performed. The dopant introduced in this implant may be phosphorus, arsenic or antimony. In order to minimize redistribution of dopants during subsequent high temperature steps of the process, arsenic is preferable because of its lower diffusion coefficient, causing more abrupt base emitter junctions and, consequently, improved microwave performance.

Figure 3:
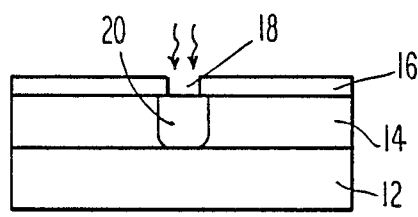

Silicon dioxide layer 16 prevents the N type dopant from being introduced into epitaxial layer 14, except for the region 20 below aperture 18, as seen in FIG. 3, including areas of layer 14 where no transistor is to be formed and areas where a transistor of opposite polarity is to be formed. The ion implantation is followed by an annealing which results in a small amount of diffusion, thus forming N++ emitter region 20 which may have a dopant concentration of $10^{20}-10^{22}$ atoms per cubic centimeter. The bottom of emitter region 20 is thus in direct contact with highly doped substrate layer 12 and is, therefore, electrically coupled to it.

If a plurality of transistors were formed in the same manner, they would be electrically coupled to each other by substrate 12 because of the low resistivity of highly doped substrate 12. Epitaxial layer 14 has high resistivity; thus, the transistors would be coupled by layer 12 only. This structure, wherein the emitters 20 are built inside the substrate and are electrically coupled to each other by heavily doped substrate layer 12, allows the formation of common emitter circuits without lead wires coupling the emitters. This is very useful in high frequency operation wherein the parasitic inductance of the lead wires degrades performance.

Figure 4:
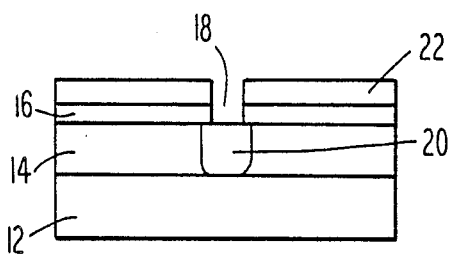

Referring now to FIG. 4, a layer of undoped polycrystalline silicon 22 is deposited upon silicon dioxide layer 16. Polycrystalline silicon layer 20 may have a thickness of 0.02 to 1 micron. In order to minimize processing temperature, it is preferable to perform this deposition by chemical decomposition of silane which requires a temperature of 580 to 680 degrees celsius, rather than by evaporation of silicon which requires approximately 1400 degrees celsius. Silicon dioxide layer 16 is not stripped before deposition of polysilicon layer 22 because it will be part of a dielectric layer. Such a dielectric layer should be as thick as possible to decrease the parasitic capacitance, especially at high frequencies. During the polysilicon deposition, polysilicon material fills aperture 18 of layer 16.

Polycrystalline silicon layer 22 comprises many small regions, called grains, in which the silicon is in a pure monocrystalline form. This is the normal result of the conventional processes for depositing polysilicon. However, these irregularly-shaped grains interfere with semiconductor properties. The normal epitaxial growth process, which results in the growth of a monocrystalline layer having no grains, requires a temperature between 1000 and 1250 degrees celsius. Temperatures in this range cause heavy redistribution of the dopants in emitter region 20 due to diffusion. This causes less abrupt PN junctions and degrades microwave performance.

To avoid these high temperatures and the resulting degradation of high frequency performance, it is preferable to perform a low temperature polysilicon deposition to form layer 22. This is followed by a thermal recrystallization which is also a relatively low temperature process, requiring only 800 degrees centigrade or less. The heating process used for the recrystallization is uniform, thereby creating no uncontrolled lateral thermal gradients.

This causes the polycrystalline silicon of polycrystalline silicon layer 22 which has filled region 18 to recrystallize into the monocrystalline form in an upward direction from emitter 20. Emitter 20 serves as the seed for the recrystallization process. In order to minimize diffusion and redistribution of the various dopants throughout the substrate, it is preferable that this thermal recrystallization process be continued only until the polysilicon in region 18 substantially above emitter 20 is recrystallized, leaving the remainder of polysilicon layer 22 in the polycrystalline form.

Alternately a small amount of lateral spreading of the recrystallization may be permitted. The regions of polycrystalline silicon layer 22 which are not used as part of the transistor serve the same purpose as silicon dioxide layer 16; that is, they widen the dielectric region in a parasitic capacitor and thereby decrease the amount of parasitic capacitance between the common emitter plane (substrate) and the base/collector terminals.

Figure 5:
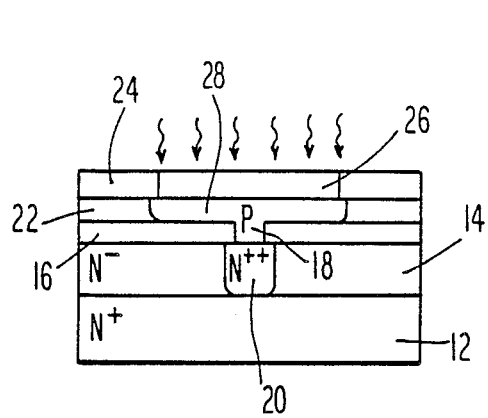

FIG. 5 shows a silicon dioxide masking layer 24 deposited upon the substrate. Masking layer 24 has a thickness of 0.2 to 0.6 microns and has an aperture 26 which is centered above recrystallized region 18. Next, a P-type ion implant is performed, causing the dopant, such as boron or boron difluoride, to be introduced in the region below aperture 26 of masking layer 24. Because region 18 contained undoped monocrystalline silicon, this ion implant need only introduce the amount of dopant required to form a P-type base in region 18. There is thus no overcompensation for previous doping required. A typical dopant concentration for base region 18 is $10^{16}$–$10^{19}$ dopant atoms per cubic centimeter.

Polycrystalline regions 28, into which dopants are introduced during the ion implant which creates active base 18, are extended passive base regions which may be used for electrical contacts and do not effect the electrical characteristics of the PN junctions formed with base 18. The size of passive base regions 28 is determined by the size of aperture 26. The conductivity of passive base regions 28 is determined by the amount of dopant implanted. In general, the higher the level of dopant, the more conductive and less noisy passive base regions 28 are. If a greater dopant concentration is required in the passive base regions 28 than in the active base region 18, a separate masking, doping, and stripping sequence is required.

Figure 6:
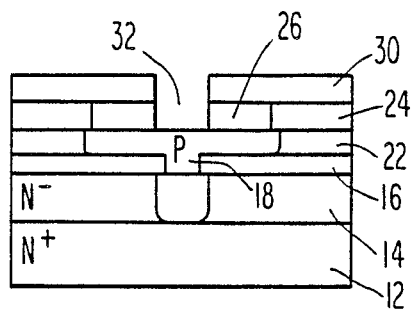
Figure 7:
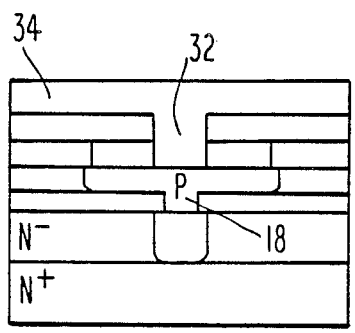

Referring to FIG. 6, an additional silicon dioxide layer 30 is formed over the substrate. Oxide layer 30 has a thickness of 0.2 to 0.6 microns. Oxide layer 30 fills the region of aperture 26 in oxide layer 24. An aperture 32 is formed in oxide layer 30 substantially above base region 18 and extending downwardly to base region 18, thus exposing the monocrystalline material of base region 18. Following the opening of aperture 32, a second polycrystalline silicon layer 34 is formed as shown in FIG. 7. The thickness of polycrystalline silicon layer 34 may be 0.02 to 1 micron. During the deposition of polysilicon layer 34, region 32 also receives polysilicon.

As previously described for region 18 in the discussion of FIG. 4, region 32 of FIG. 7 is recrystallized. In this recrystallization process, a relatively low temperature, 800 degrees celsius, is maintained for a relatively short period of time in order to prevent diffusion of the various dopants already in the substrate. It is preferable that thermal energy be supplied from above layer 12 when performing the recrystallizations. However, thermal energy may also be supplied from above and below. As the polycrystalline material in region 32 is heated, the monocrystalline material of region 18 underneath it serves as a seed causing recrystallization of region 32 to proceed from the bottom in an upward direction.

The recrystallization temperature is maintained for an amount of time sufficient to allow recrystallization to spread from the bottom of region 32 to the top of layer 34, but is not allowed to spread laterally through layer 34 beyond the region substantially above region 32. Although lateral spreading of the recrystallization through polysilicon layer 34 would not in itself interfere with the performance of the transistor, the recrystallization is terminated before lateral spreading of recrystallization in order to minimize migration of dopants elsewhere.

Figure 8:
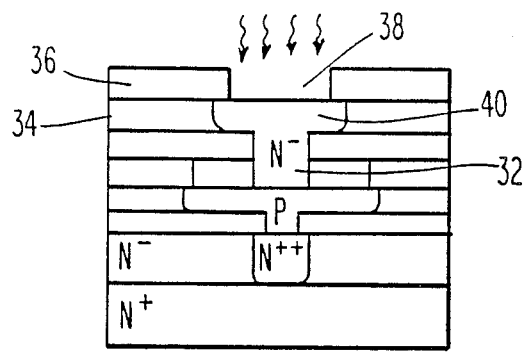

Referring now to FIG. 8, the contact collector photocut is performed. In this step, silicon dioxide layer 36 is formed on the substrate and an aperture 38 is opened substantially above recrystallized region 32. Silicon dioxide layer 36 has a thickness of 0.2 to 0.6 microns.

Region 32 beneath aperture 38 is implanted with high energy N-type dopants by ion implantation or diffusion, thus forming collector region 32. The high energy ions of this implantation penetrate through region 40 in order to dope the collector region 32. The dopant concentration of collector region 32 may be $10^{15}$–$10^{18}$ dopant atoms per cubic centimeter.

Additionally, low energy N+ ions (not shown) are implanted forming collector contact region 40. The N+ ions, because of their low energy level, do not penetrate through collector contact region 40 and into collector region 32, rather, they remain substantially at the level of polysilicon layer 34.

The N type ions used in these implantations may be arsenic, antimony, or phosphorus. The high energy implant and the low energy implant may be performed in either order. The two implants may be performed with the same dopant or with different dopants.

Figure 9:
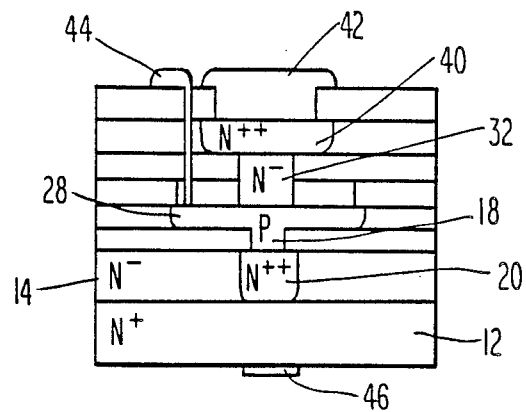

Referring now to FIG. 9, the collector, emitter, and base terminals are shown. Emitter terminal 46 is affixed to highly doped silicon layer 12. Because of the high level of dopant, layer 12 is highly conductive and is effective to electrically couple emitter terminal 46 to emitter 20. Epitaxial layer 14 is lightly doped and highly resistive, thereby helping to insulate emitter terminal 46 from structures other than emitter 20.

It should be understood by those skilled in the art that, when a plurality of integratable bipolar transistors such as that depicted in FIG. 9 are formed in the same substrate 12 in the manner of the present invention, emitter terminal 46 is coupled by substrate to the emitters of the other transistors formed in this manner and may be used as a connection to a common emitter circuit. It will be further understood that emitter terminal 46 may thus be used as a terminal of a multistage common emitter 15 amplifier circuit in which the emitters of the transistors are electrically connected to each other by electrically conductive substrate 12.

A hole or groove extending from the surface of silicon dioxide layer 36 downwardly to passive base region 28 is formed by ion beam milling and/or reactive ion etching for base terminal 44. This involves impelling particles at a high velocity unitl a hole of the required depth is dug into the substrate. As previously described, passive base region 28 may be highly doped to provide a high conductivity, low noise path to elecrically couple active base region 18.

Collector terminal 42 is deposited on highly doped, and therefore highly conductive, collector contact region 40, thereby electrically coupling collector terminal 42 to collector region 32. Terminals 42, 44, and 46 may be formed from any suitable conductive material such as metal or heavily doped polycrystalline silicon.

Figure 10:
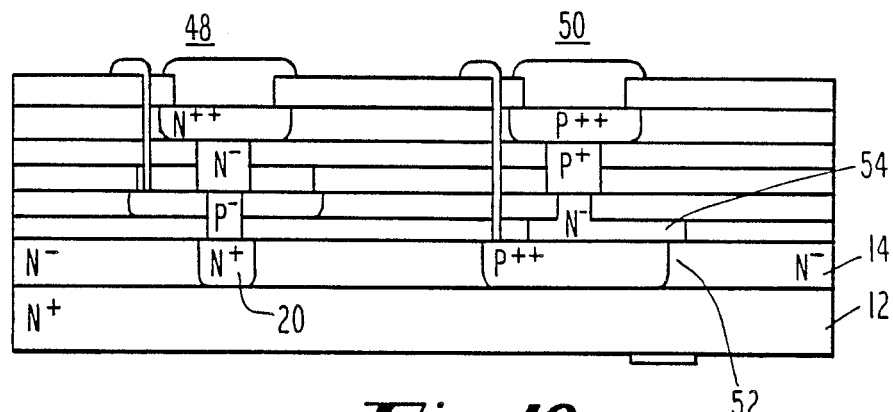
FIG. 10 shows the cascoding of two transistors made according to the method of FIGS. 1 to 9.

As previously described, the process used to form the bipolar transistor shown in FIG. 9 may be used to form either an NPN bipolar transistor or a PNP bipolar transistor. The transistor shown in FIG. 9 is an NPN. FIG. 10 shows both an NPN transistor 48 and a PNP transistor 50 formed on the same substrate 12. NPN transistor 48 is similar to the NPN transistor shown in FIG. 9. In forming transistors 48,50 silicon dioxide masking layers are used to alternately protect each area on which a transistor is being formed during the time that implantations are performed for the other transistor. The emitter 20 of transistor 48 is electrically coupled to the base 54 of the PNP transistor 50 by substrate 12 and region 52 of N-layer 14. While N- layer 14 has a large resistance in the longitudinal direction, because it is so thin it is effective to electrically couple substrate 12 to the region of base 54 which overhangs region 56. Region 56 may be either a collector or an emitter depending on circuit design requirements. Region 56 is not electrically coupled to substrate 12 because region 56 is P conductivity type and substrate 12 is N conductivity type causing the junction between region 56 and substrate 12 to be an isolated junction.

Thus, it is possible to cascode transistors formed according to the present invention when a plurality of such transistors are formed on the same substrate where it is understood that cascode refers to a coupled common emitter-common base configuration. It will be understood by those skilled in the art that in a common emitter amplifier stage the emitter is common to the input and to the output of the stage.

In the manner previously described, PNP transistor 50 may be replaced with one or more NPN transistors such as the type shown as NPN transistor 48. This produces a multistage common emitter circuit in which the emitters of all the tranistors are connected to each other by electrically conductive substrate 12.

What is claimed is:

1. A semiconductor device having at least first and second transistors comprising:
    a semiconductor substrate with a monocrystalline layer formed thereupon;
    a first transistor region of the first transistor and a second transistor region of the second transistor disposed within portions of the monocrystalline layer;
    a first base region formed of monocrystalline semiconductor disposed substantially above the first transistor region;
    a second base region formed of monocrystalline semiconductor disposed substantially above the second transistor region and extending laterally substantially beyond the second transistor region forming an overhanging portion;
    third and fourth transistor regions disposed substantially above the first and second base regions, respectively;
    the first transistor region of the first transistor and the second base region of the second transistor being electrically coupled by way of the substrate, the monocrystalline layer, and the overhanging portion.

2. The semiconductor device of claim 1 in which the first and second transistor regions are formed of opposite conductivity type semiconductor material.

3. The semiconductor device of claim 1 in which the first and second base regions are substantially laterally surrounded by polycrystalline material.

4. The semiconductor device of claim 3 in which the third and fourth transistor regions are substantially laterally surrounded by polycrystalline material.

5. The semiconductor device of claim 1 in which the first and fourth transistor regions are emitters.

6. A semiconductor device having emitter, base and collector regions comprising:
    a doped semiconductor substrate;
    a continuous epitaxial first monocrystalline layer formed on said substrate;
    an emitter region within the first monocrystalline layer;
    a first oxide layer above the first monocrystalline layer, said first oxide layer having a hole, smaller than the emitter region, above the emitter region;
    a first semiconductive layer above the first oxide layer, said first semiconductive layer having polycrystalline and monocrystalline base regions, said monocrystalline base region completely filling the hole in the first oxide layer and extending beyond the periphery of the hole;
    a second oxide layer disposed above the first semiconductor layer, said second oxide layer having a hole, smaller than the monocrystalline base region, located above the base region; and
    a second semiconductive layer above the second oxide layer, said second semiconductive layer having polycrystalline and monocrystalline collector regions, said monocrystalline collector region completely filling the hole in the second oxide layer, thereby forming a first transistor.

7. A semiconductor device comprising a plurality of devices of claim 6 in which the emitters are electrically coupled by the substrate.

8. The semiconductor device of claim 7 further comprising:
    a collector region disposed within a second portion of the first monocrystalline layer;
    a base region disposed above the collector region;
    a emitter region disposed over the base region thereby forming a second transistor wherein the emitter of the first transistor is electrically coupled to the collector of the second transistor by the semiconductor substrate.

* * * * *